United States Patent
Yang et al.

(10) Patent No.: US 9,024,285 B2
(45) Date of Patent: May 5, 2015

(54) NANOSCALE SWITCHING DEVICES WITH PARTIALLY OXIDIZED ELECTRODES

(75) Inventors: Jianhua Yang, Palo Alto, CA (US);
Gilberto Ribeiro, Menlo Park, CA (US);
R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 292 days.

(21) Appl. No.: 13/636,814

(22) PCT Filed: Apr. 19, 2010

(86) PCT No.: PCT/US2010/031639
§ 371 (c)(1),
(2), (4) Date: Sep. 24, 2012

(87) PCT Pub. No.: WO2011/133138
PCT Pub. Date: Oct. 27, 2011

(65) Prior Publication Data
US 2013/0026440 A1    Jan. 31, 2013

(51) Int. Cl.
*H01L 47/00* (2006.01)
*H01L 45/00* (2006.01)
*H01L 27/24* (2006.01)

(52) U.S. Cl.
CPC ............ *H01L 45/08* (2013.01); *H01L 27/2463* (2013.01); *H01L 45/1253* (2013.01); *H01L 45/146* (2013.01); *Y10S 438/90* (2013.01)

(58) Field of Classification Search
CPC ...... H01L 45/145; H01L 45/146; H01L 45/08
USPC .................................. 365/148; 257/2, 3, 4, 5
See application file for complete search history.

(56) References Cited

U.S. PATENT DOCUMENTS

| | | | | |
|---|---|---|---|---|
| 7,983,065 B2 * | 7/2011 | Samachisa | ...................... | 365/51 |
| 7,985,962 B2 * | 7/2011 | Bratkovski et al. | ................ | 257/4 |
| 8,063,395 B2 * | 11/2011 | Xia et al. | ............................ | 257/4 |

(Continued)

FOREIGN PATENT DOCUMENTS

| CN | 101228091 A | 7/2008 |
|---|---|---|
| CN | 101548403 A | 9/2009 |

OTHER PUBLICATIONS

PCT Search Report, Jan. 4, 2011, International Application No. PCT/US2010/031639, Filed Apr. 19, 2010.

*Primary Examiner* — Eva Y Montalvo
*Assistant Examiner* — Samuel Lair
(74) *Attorney, Agent, or Firm* — Hewlett-Packard Patent Department

(57) ABSTRACT

A nanoscale switching device is provided. The device comprises: a first electrode of a nanoscale width; a second electrode of a nanoscale width; an active region disposed between the first and second electrodes, the active region having a non-conducting portion comprising an electronically semi-conducting or nominally insulating and a weak ionic conductor switching material capable of carrying a species of dopants and transporting the dopants under an electric field and a source portion that acts as a source or sink for the dopants; and an oxide layer either formed on the first electrode, between the first electrode and the active region or formed on the second electrode, between the second electrode and the active region. A crossbar array comprising a plurality of the nanoscale switching devices is also provided. A process for making at least one nanoscale switching device is further provided.

13 Claims, 6 Drawing Sheets

(56) References Cited

U.S. PATENT DOCUMENTS

| | | | |
|---|---|---|---|
| 8,223,539 B2* | 7/2012 | Smythe et al. | 365/178 |
| 8,502,343 B1* | 8/2013 | Jha et al. | 257/537 |
| 8,749,023 B2* | 6/2014 | Hong et al. | 257/537 |
| 2007/0019922 A1 | 1/2007 | Sasagawa et al. | |
| 2008/0090337 A1* | 4/2008 | Williams | 438/133 |
| 2008/0185572 A1 | 8/2008 | Chiang et al. | |
| 2010/0065803 A1* | 3/2010 | Choi et al. | 257/4 |
| 2011/0186801 A1* | 8/2011 | Yang et al. | 257/4 |
| 2012/0012807 A1* | 1/2012 | Yamaguchi et al. | 257/4 |
| 2013/0121060 A1* | 5/2013 | Lee et al. | 365/148 |

* cited by examiner

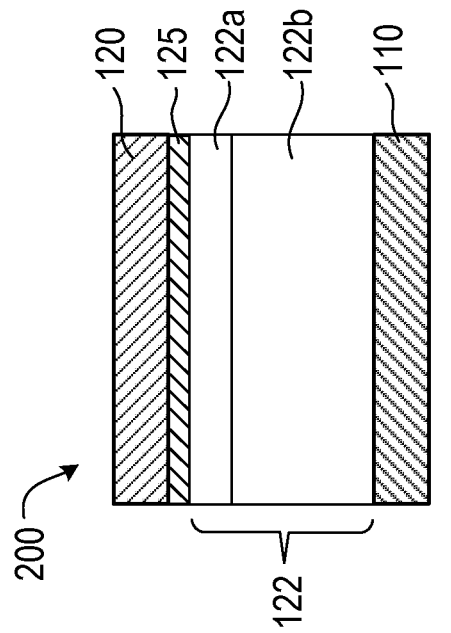
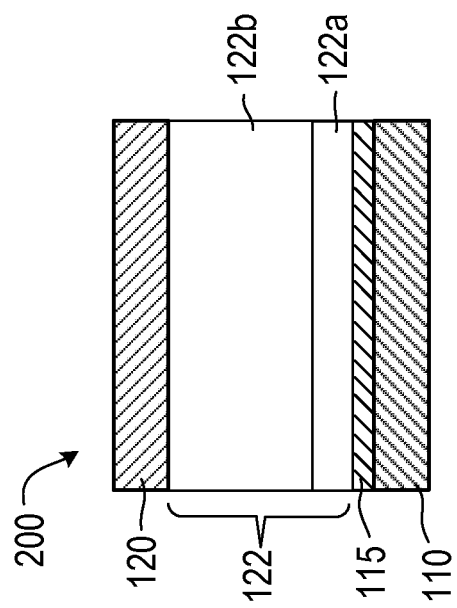
Fig. 2A
Fig. 2B

NANOSCALE SWITCHING DEVICES WITH PARTIALLY OXIDIZED ELECTRODES

STATEMENT REGARDING FEDERALLY SPONSORED RESEARCH OR DEVELOPMENT

This invention has been made with government support. The government has certain rights in the invention.

BACKGROUND ART

The continuous trend in the development of electronic devices has been to minimize the sizes of the devices. While the current generation of commercial microelectronics are based on sub-micron design rules, significant research and development efforts are directed towards exploring devices on the nano-scale, with the dimensions of the devices often measured in nanometers or tens of nanometers. Besides the significant reduction of individual device size and much higher packing density compared to microscale devices, nanoscale devices may also provide new functionalities due to physical phenomena on the nanoscale that are not observed on the microscale.

For instance, electronic switching in nanoscale devices using titanium oxide as the switching material has recently been reported. The resistive switching behavior of such a device has been linked to the memristor circuit element theory originally predicted in 1971 by L. O. Chua. The discovery of the memristive behavior in the nanoscale switch has generated significant interest, and there are substantial ongoing research efforts to further develop such nanoscale switches and to implement them in various applications. One of the many important potential applications is to use such a switching device as a memory unit to store digital data.

The devices recently reported using titanium oxide (and other oxides) typically have involved two oxide phases ($TiO_2$ and an oxygen-deficient phase, $TiO_{2-x}$). The two oxide phases (or one oxide phase, $TiO_2$, bounded by two oxide phases, $TiO_{2-x}$) are contacted by metal electrodes, typically, Pt, Ru, W, or other suitable metals.

In such metal/oxide/metal memristive junctions, the electrode materials usually tend to reduce the switching materials and induce some oxygen vacancies at the metal/oxide interface, which is the crucial region for switching and needs to be well-controlled.

BRIEF DESCRIPTION OF THE DRAWINGS

FIGS. 2A-2B depict a $TiO_{2-x}$ region contacted on the top and bottom thereof with a Pt electrode, in accordance with embodiments of the invention, wherein in FIG. 2A, the bottom Pt electrode is partially oxidized to form a layer of $PtO_x$ and wherein in FIG. 2B, the top Pt electrode is partially oxidized to form a layer of $PtO_x$.

BEST MODES FOR CARRYING OUT THE INVENTION

Reference is made now in detail to specific embodiments, which illustrates the best mode presently contemplated by the inventors for practicing the invention. Alternative embodiments are also briefly described as applicable.

Figure 1:
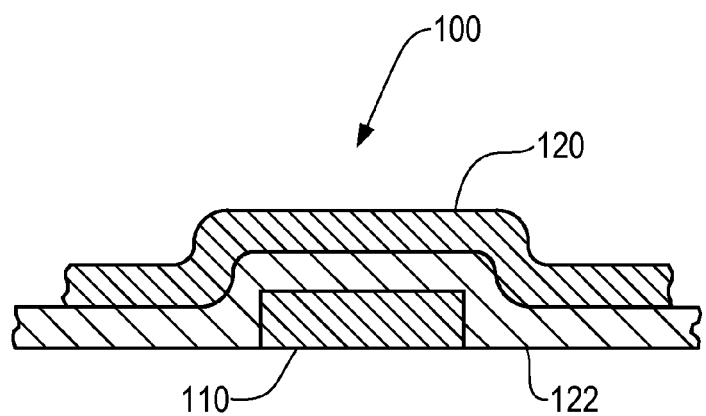
FIG. 1 is a cross-sectional view of a nanoscale switching device in accordance with an embodiment of the invention.

FIG. 1 shows an embodiment of a nanoscale switching device 100 in accordance with the invention that does not require an electroforming process to condition it for normal switching operations. In other words, the device is "electroforming-free." Further, switching voltages for the first switching cycle from the as-fabricated state are expected to be lower than those would be required for electroformed memristors.

The switching device 100 includes a bottom electrode 110 and a top electrode 120, and an active region 122 disposed between the two electrodes. Each of the bottom and top electrodes 110 and 120 is formed of a conducting material and has a width and a thickness on the nanoscale. As used hereinafter, the term "nanoscale" means the object has one or more dimensions smaller than one micrometer. In this regard, each of the electrodes may be in the form of a nanowire. Generally, the active region 122 contains a switching material that is capable of carrying a selected species of dopants such that the dopants can drift through the switching material under a sufficiently strong electric field. The drifting of the dopants results in a redistribution of dopants in the active region, which is responsible for switching behavior of the device, as will be described in greater detail below.

Previous work describes memristors comprising a switch having the following characteristics (see, e.g., R. Stanley Williams, US Patent Publication 2008/0090337A1, Apr. 17, 2008, the content of which is incorporated herein in its entirety):

A primary active layer, or region, of the switch comprises a thin film of a material that is electronically semiconducting or nominally electronically insulating and also a weakly ionic conductor. The primary active material is capable of transporting and hosting ions that act as dopants to control the flow of electrons through the switch. The basic mode of operation is to apply an electrical field (the drift field, which may exceed some threshold for enabling the motion of the ions in the primary material) across the switch large enough to cause an ionic species to be transported into or out of the primary material via ionic transport. The ionic species are specifically chosen from those that act as electrical dopants for the primary material, and thereby change the electrical conductivity of the material from low conductivity (i.e. an undoped semiconductor or insulator— switch-OFF configuration) to high conductivity (doped to provide a higher conductivity—switch-ON configuration) or from high electrical conductivity to low conductivity (switch-ON to switch-OFF). Furthermore, the primary material and the dopant species are chosen such that the drift of the ions into or out of the primary material is possible but not too facile, to ensure that the switch will remain in whatever state it is set for a reasonably long time, perhaps many years at room temperature. This is to make sure the switch is nonvolatile, that is, that it holds its state after the drift field has been removed. The switch is a two-terminal device—applying a high bias to the switch causes both electron current and ion current to flow, whereas at a low bias the flow of ion current is negligible, which allows the switch to hold its resistance state.

A secondary active layer, or region, comprises a thin film of a material that is a source of dopants for the primary material. These dopants may be impurity atoms such as hydrogen or some other cation species, such as alkali or transition metals, that act as an electron donor for the primary material, or they may be anion vacancies, which in the primary material are charged and therefore are also donors for the lattice. It is also possible to drive anionic species into the primary host material, which will become electron acceptors (or hole donors).

The primary active material may be a thin film (generally less than 50 nm thick), and is in many cases nanocrystalline, nanoporous or amorphous. The mobility of the dopant species in such nanostructured materials is much higher than in a bulk crystalline material, since diffusion can occur through grain boundaries, pores or through local structural imperfections in an amorphous material. Also, because the film is so thin, the amount of time required to drift enough dopants into or out of a local region of the film to substantially change its conductivity is relatively rapid (e.g., the time t required for a diffusive process varies as the square of the distance covered, so the time to diffuse one nanometer is one-millionth the time required to diffuse one micrometer).

The switching materials (primary active and secondary active materials) are contacted on either side by metal electrodes or wires, or on one side by a semiconductor and the other side by a metal. The contact of the metal to the switching material depletes the semiconductor of free charge carriers, so in fact the material has a net charge that depends on the identity of the dopants—positive in the case of donors and negative in the case of acceptors. The metal-semiconductor contact regions electrically resemble Schottky barriers. The traditional description of a metal-semiconductor Schottky barrier is modified by the fact that the materials are structured at the nanometer scale, and so the structural and electrical properties are not averaged over the large distances over which the theory of semiconductor-metal contacts has been developed.

Conduction of electrons through the primary active material is via quantum mechanical tunneling of the electrons. When the semiconducting material is essentially intrinsic, the tunneling barrier is high and wide, and thus the conductivity through the switch is low (OFF state). When a significant number of dopant species have been injected into the semiconductor, the width and perhaps the height of the tunneling barrier are diminished by the potential of the charged species. This results in an increase of the conductivity of the switch (ON state).

The ability of the charged species to diffuse into and out of the primary material is substantially improved if one of the interfaces connecting the switch to the metallic or semiconducting electrodes is non-covalently bonded. Such an interface may be caused by a void in the material or it may be the result of an interface that contains a molecular material that does not form covalent bonds with the electrode, the primary switch material, or both. This non-covalently bonded interface lowers the activation energy of the atomic rearrangements that are required for drift of the ionic species in the primary material. This interface is essentially an extremely thin insulator, and adds very little to the total series resistance of the switch.

Many examples of suitable combinations are given in the foregoing reference, including oxides, sulfides, selenides, nitrides, phosphides, arsenides, chlorides, and bromides of the transition and rare earth metals, with the alkaline earth metals often being present in compounds. Further, there are the various alloys of like compounds with each other, which can have a wide range of composition if they are mutually soluble in each other. Then there are the mixed compounds, in which there are two, three or more different metal atoms combined with some number of the electronegative elements. The dopants may be anion vacancies or different valent elements doped into the host.

In accordance with the teachings herein, in order to control the interfaces and avoid a lack of oxygen atoms, the electrode materials may be partially oxidized at the interface region. Experimentally, very rectifying I-V junctions have been identified that can be produced with a partially oxidized electrode, which suggests the integrity O atom in $TiO_2$ at the interface region.

Thus, electrodes comprising, for example, Pt, Ru, W, etc. are partially oxidized to form a thin oxide layer at the interface between the electrode and the active region. This ensures that the interface is oxygen-rich and that the titanium oxide (or other metal oxide) is close to $TiO_2$.

FIGS. 2A and 2B depict alternate embodiments. In both embodiments, a memristor 200 is shown, comprising the active layer 122 sandwiched between the two electrodes 110, 120. The memristor 200 is modified from the memristor 100 shown in FIG. 1 by the addition of a partially oxidized bottom electrode 115 (FIG. 2A) or a partially oxidized top electrode 125 (FIG. 2B)

The active region in FIGS. 2A-2B comprises Ti—O region contacted on the top and bottom thereof with a Pt electrode, in accordance with embodiments of the invention, wherein in FIG. 2A, the bottom Pt electrode is partially oxidized to form a layer of $PtO_x$ and wherein in FIG. 2B, the top Pt electrode is partially oxidized to form a layer of $PtO_x$.

The active region 208 of the switching device includes a relatively thin non-conducting portion (primary active region) 122a and a relatively thick source portion (secondary active region) 122b. The non-conducting portion 122a comprises an electronically semiconducting or nominally insulating and a weak ionic conductor. An example of such a material is titanium dioxide ($TiO_2$). The source portion 122b comprises a source/sink of dopants (not shown), which, in the case of titanium dioxide, consist of oxygen vacancies. The formula of the source layer is often represented as $TiO_{2-x}$ where x is a value much less than 1.

The non-conducting portion may be thicker than the source portion, and the exact thickness of the source portion is not critical. For example, the initial thickness of the non-conducting portion 122a may be on the order of 10 nm or less and the thickness of the source portion 122b may range from 10 nm to 200 nm, in some embodiments.

It will be noted that the source layer 122b is on the opposite side of the non-conducting layer 122a from the metal oxide layer 115, 125 so that the device will always have an ohmic-like conducting interface between the source portion and the metal electrode. This ohmic-like interface remains conducting and switching occurs at the interface between the non-conducting layer and the electrode. The thin layer of electrode oxide may partially or completely lose its oxygen to the adjacent Ti oxide layer and therefore makes the adjacent Ti oxide close to its stoichiometry. Therefore, the device switching polarity is well defined in the following way: a positive voltage on the partially oxidized electrode turns the device OFF to a high resistance state and a negative voltage on that electrode turns the device ON to a low resistance state. If the source layer 122b and the metal oxide layer 115, 125 were on the same side, ohmic contact that is needed on one side of the device would be lost and the switching polarity would not be well defined.

The nanoscale switching device 200 can be switched between ON and OFF states by controlling the concentration and distribution of the dopants in the active layer 122. When a DC switching voltage from a voltage source (not shown) is applied across the top and bottom electrodes 120 and 10, an electric field is created across the active region 122. This electric field, if of a sufficient strength and proper polarity, may drive dopants from the source region 122b into the non-conducting region 122a, and cause the dopants to drift through the non-conducting material towards the top electrode 120, thereby turning the device 200 into an ON state.

If the polarity of the electric field is reversed, the dopants may drift in an opposite direction across the active layer 122 and away from the top electrode 120, thereby turning the device 200 into an OFF state. In this way, the switching is reversible and may be repeated. Due to the relatively large electric field needed to cause dopant drifting, after the switching voltage is removed, the locations of the dopants remain stable in the switching material.

The state of the switching device 200 may be read by applying a read voltage to the top and bottom electrodes 120 and 110 to sense the resistance across these two electrodes. The read voltage is typically much lower than the threshold voltage required to cause drifting of the ionic dopants between the top and bottom electrodes, so that the read operation does not alter the ON/OFF state of the switching device.

By way of example, the non-conducting material may be $TiO_2$ and the source material may be oxygen vacancies ($V_o^{2+}$). The oxygen vacancies, also known as dopants, results in the formation of regions of $TiO_{2-x}$ where x may be a number much smaller than 1. The repeatable generation of $TiO_{2-x}$ and return to $TiO_2$ enables the overall resistance of the switching device 200 to be reversibly altered, as is now well-known in memristive technology.

The switching behavior described above may be based on different mechanisms. In one mechanism, the switching behavior may be an "interface" phenomenon. Initially, with a low dopant level in the non-conducting material 122b the interface of the non-conducting material and the top electrode 120 may behave as a Schottky-like barrier, with an electronic barrier that is difficult for electrons to tunnel through. As a result, the device has a relatively high resistance. When a switching voltage to turn the device ON is applied, the dopants drift towards the top electrode 120. The increased concentration of dopants in the electrode interface region changes its electrical property from a Schottky-like barrier to one more like an ohmic contact, with a significantly reduced electronic barrier height or width. As a result, electrons can tunnel through the interface much more easily, and this may account for the significantly reduced overall resistance of the switching device. On the other hand, the interface between the bottom electrode 110 and the source layer 122a remains essentially ohmic.

In another mechanism, the reduction of resistance may be a "bulk" property of the switching material in the switching layer. An increase of the dopant level in the switching material causes the resistance across the switching material to fall, and this may account for the decrease of the overall resistance of the device between the top and bottom electrodes. It is also possible that the resistance change is the result of a combination of both the bulk and interface mechanisms. Even though there may be different mechanisms for explaining the switching behavior, it should be noted that the present invention does not rely on or depend on any particular mechanism for validation, and the scope of the invention is not restricted by which switching mechanism is actually at work.

The oxidation of the bottom electrode 110 may be performed by any of the common oxidation processes, including, but not limited to, oxygen plasma, active sputtering from $PtO_2$ target using mixture of argon and oxygen, and other low temperature processes, such as ozone oxidation, among others. The bottom electrode 110 may or may not be formed on a substrate (not shown). If the substrate is employed, it may comprise any common insulating, dielectric material, such as oxides (e.g., silica or alumina or magnesia), titanates, glass, polymer, strontium titanates, and the like. The thickness range of the oxide formed on the bottom electrode is typically less than 5 nm in some embodiments, 1 to 2 nm in other embodiments, and even less, e.g., 0.5 nm in still other embodiments.

While the discussion above has been directed to interposing the metal oxide between the bottom electrode 110 and the active layer 122 (oxide 115), it is just as feasible to interpose the metal oxide between the top electrode 120 and the active layer (oxide 125). For example, a thin layer of metal (not shown), e.g., platinum or other suitable metal, may be deposited on the active layer 122, such as by sputtering. The thin metal layer, on the order of 1 nm or so in thickness, may then be fully oxidized to form the oxide layer 125. The second (top) electrode metal 120 may then be formed on the metal oxide. ALD (atomic layer deposition) and sputtering are alternative ways to forming the metal oxide 125.

It should be pointed out that the vertical thickness of memristor oxide 122 should not be greater than nanowire width (the space between two neighboring memristors).

Figure 3:
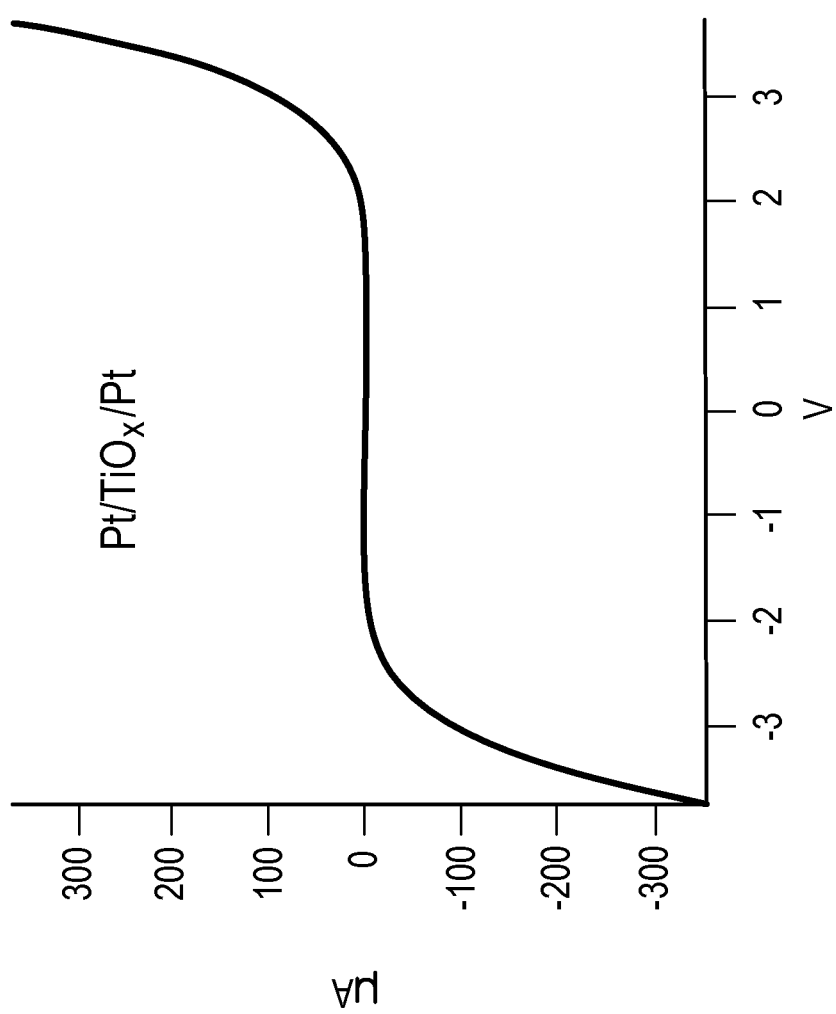
FIG. 3, on coordinates of current and voltage, is an I-V curve of the system $Pt/TiO_x/Pt$.

FIG. 3, on coordinates of current and voltage, is an I-V curve of the system $Pt/TiO_x/Pt$. This is a conventional memristor and illustrates typical memristor IV characteristics.

Figure 4:
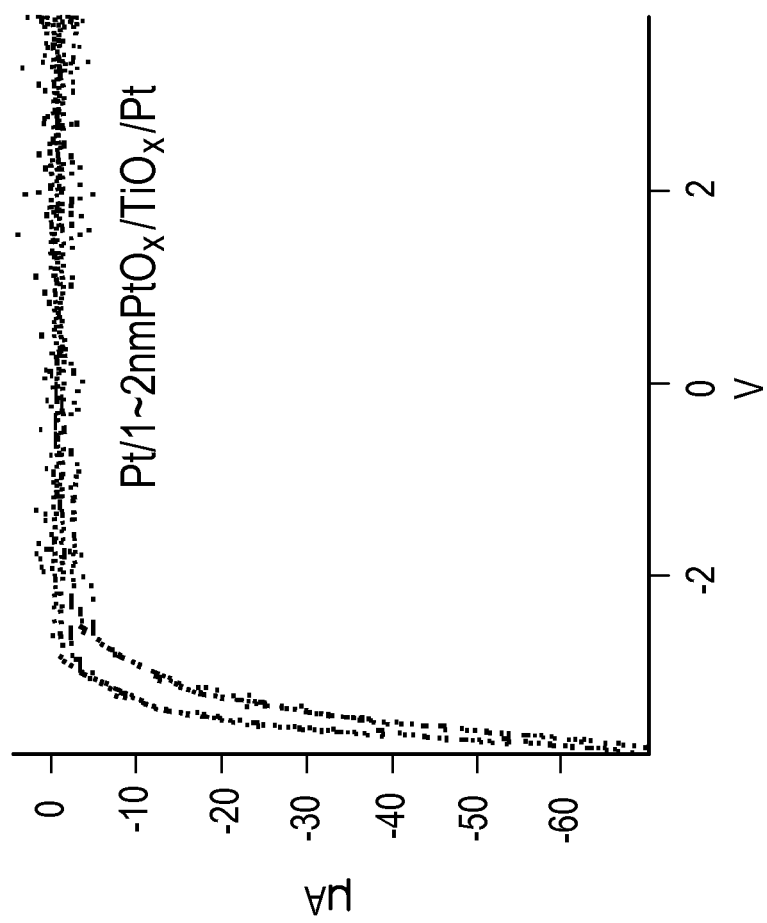
FIG. 4, on coordinates of current and voltage, is an I-V curve of the system $Pt/PtO_x/TiO_x/Pt$, in accordance with embodiments of the invention.

FIG. 4, on coordinates of current and voltage, is an I-V curve of the system $Pt/PtO_x/TiO_x/Pt$, in accordance with embodiments of the invention. This is the structure depicted in FIG. 2A. This is a virgin-state I-V plot. The bottom interface (the interface between the metal oxide 115 and the memristor oxide 122) has more $O_2$, while the top interface (the interface between the memristor oxide 122 and the top electrode 120) has more vacancies. A negative voltage applied to the top electrode 120 turns the device OFF; +V on top electrode turns device ON. The structure creates rectification and asymmetry, as seen in the curve, but the device is otherwise symmetric.

Figure 5:
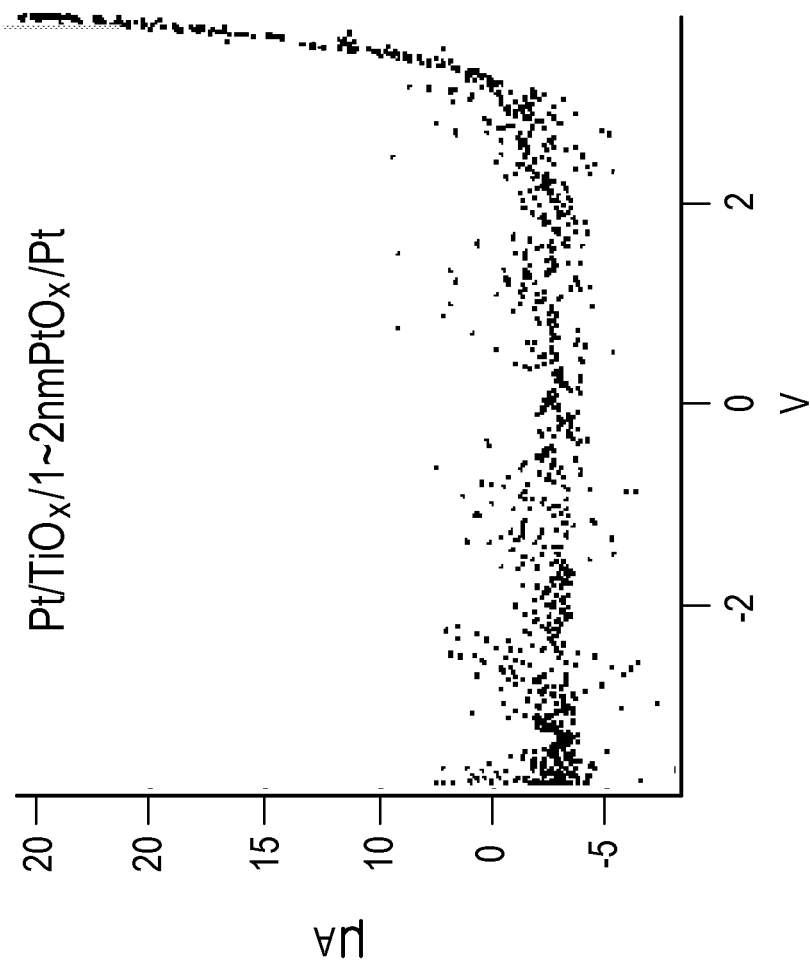
FIG. 5, on coordinates of current and voltage, is an I-V curve of the system $Pt/TiO_x/PtO_x/Pt$, in accordance with embodiments of the invention.

FIG. 5, on coordinates of current and voltage, is an I-V curve of the system $Pt/TiO_x/PtO_x/Pt$, in accordance with embodiments of the invention. This is the structure depicted in FIG. 2B. This configuration is opposite to that shown in FIG. 4, namely, the rectification is in the opposite direction. The device is turned ON by a +V turns the device OFF. The scatter (noise) in the data masks the asymmetry, but it is present as in FIG. 4.

In obtaining the measurements on the devices that are the subject of FIGS. 3-5, external quasi-DC voltage sweeps up to about 4V were applied.

Figure 6:
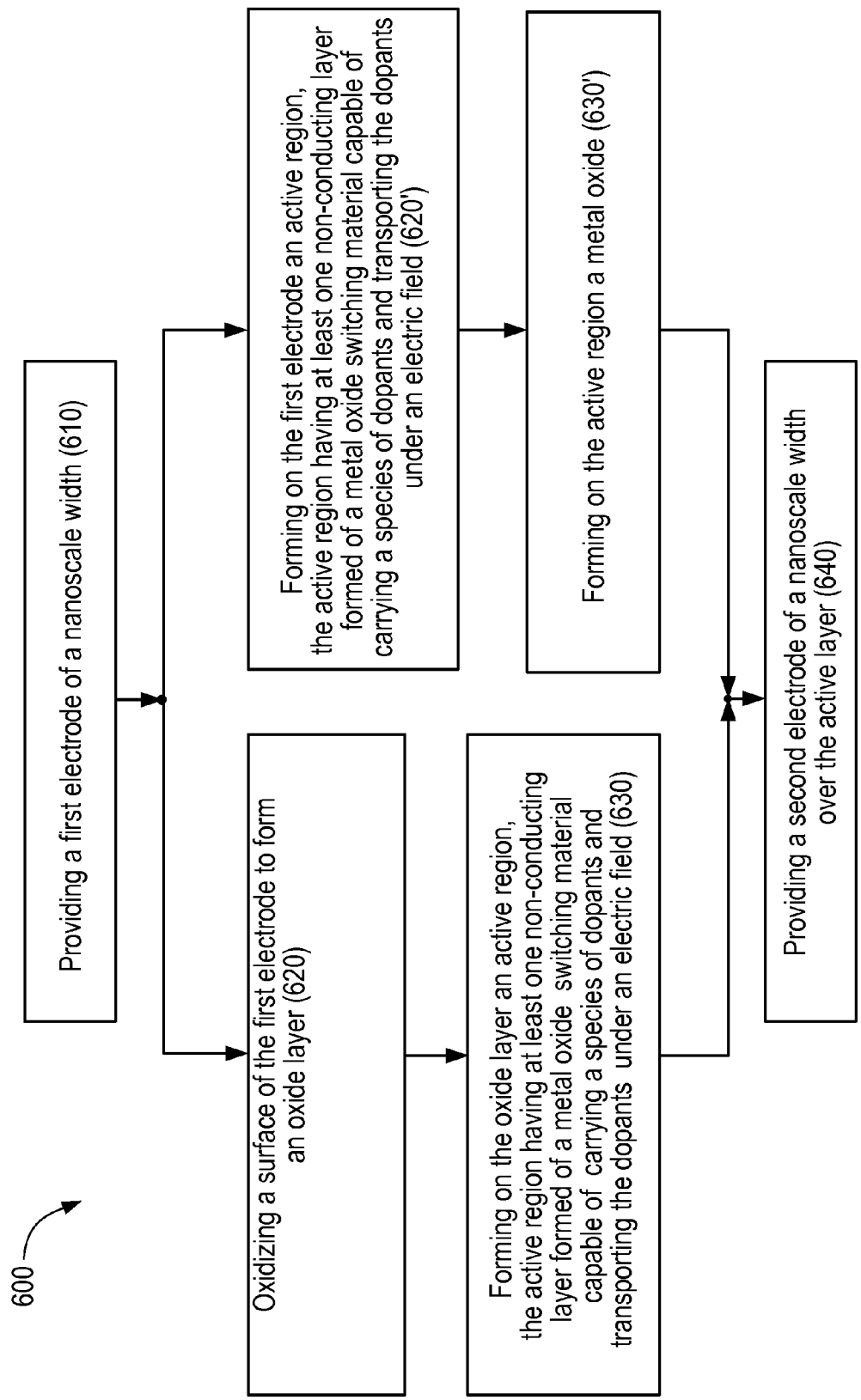
FIG. 6 is a process flow chart for fabricating a memristor in accordance with embodiments disclosed herein.

FIG. 6 is a flow chart of an exemplary process 600 used to form the device 200. First, the bottom electrode 110 is formed (Step 610). The bottom electrode is next oxidized to form the oxide 115 (Step 620). The active layer 122, such as $TiO_2$, or other electronically semiconducting or nominally insulating and a weak ionic conductor, is then formed on the oxidized layer 115 (Step 630). Finally, the top electrode 120 is formed on the active layer 122 (Step 640). Alternatively, the active region 122 is formed on the bottom electrode (Step 620'). A thin layer of metal is formed on the active region 122 and is fully oxidized to form the oxide 125 (Step 630'). The top electrode 120 is then formed over the active layer, on the oxide 125 (Step 640).

The electrodes 110, 120 may comprise any of the common electrode materials, such as Pt, Ru, W, TiN, TaN, Cu, Al, Pd, Ta, Nb, etc., and may be the same or different. The thickness of the electrodes 110, 120 is that commonly employed in the construction of memristors, typically on the order of 10 to 100 nm or thicker. The thickness of the oxide 115 or 125 is in the range of 5 nm, 1 to 2 nm.

The use of partially oxidized electrodes in memristors controls the presence of oxygen vacancies at the interface region due to the reaction between electrodes and switching materials.

Advantages provided by the use of partially oxidized electrodes are many, including (1) controlling the rectification of the I-V curves; 2) ensuring the oxygen content at the interface and avoid the lack of oxygen atoms in the $TiO_2$ layer at the interface region; 3) easy implementation; and 4) defining the switching polarity of the devices.

Figure 7:
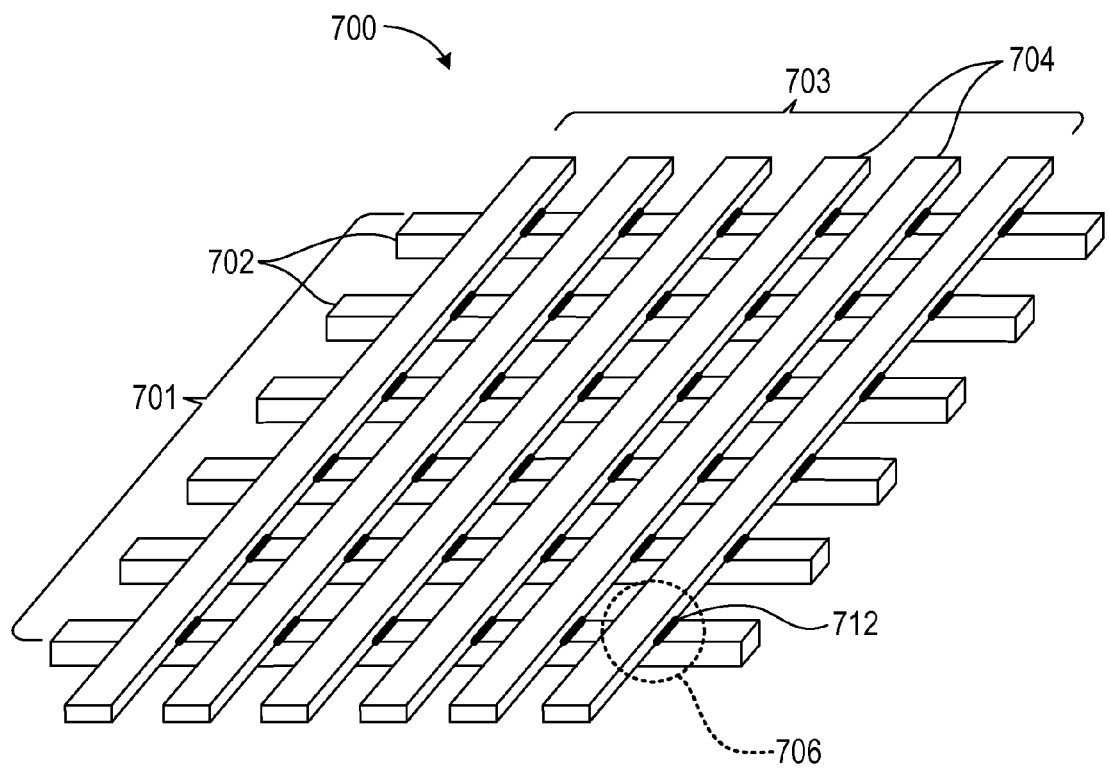
FIG. 7 is a schematic cross-sectional view of a crossbar array of electroforming-free nanoscale switching devices in accordance with an embodiment of the invention.

The nanoscale switching device 200 with partially oxidized electrodes may be formed into an array for various applications. FIG. 7 shows an example of a two-dimensional array 700 of such switching devices. The array 700 has a first group 701 of generally parallel nanowires 702 running in a first direction, and a second group 703 of generally parallel nanowires 704 running in a second direction at an angle, such as 90 degrees, from the first direction. The two layers of nanowires 702 and 704 form a two-dimensional lattice which is commonly referred to as a crossbar structure, with each nanowire 702 in the first layer intersecting a plurality of the nanowires 704 of the second layer. A two-terminal switching device 706 may be formed at each intersection of the nanowires 702 and 704. The switching device 706 has a nanowire of the second group 703 as its top electrode and a nanowire of the first group 701 as the bottom electrode, and an active region 712 containing a switching material between the two nanowires. In accordance with an embodiment of the invention, one of the two electrodes contacting the active region 712 has partially oxidized electrodes, and may have a structure according to an embodiment, such as described above with reference to FIGS. 2A-2B.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A nanoscale switching device, comprising:
   a first electrode of a nanoscale width;
   a second electrode of a nanoscale width;
   an active region disposed between the first and second electrodes, the active region having a non-conducting portion comprising an electronically semiconducting or nominally insulating and a weak ionic conductor switching material capable of carrying a species of dopants and transporting the dopants under an electric field and a source portion that acts as a source or sink for the dopants; and
   an oxide layer either formed on the first electrode, between the first electrode and the active region or formed on the second electrode, between the second electrode and the active region, wherein the electrode with which the oxide layer is associated is metal and wherein the oxide layer is an oxide of the metal.

2. The nanoscale switching device of claim 1 wherein the active region comprises a multi-valent metal oxide.

3. The nanoscale switching device of claim 2, wherein the multi-valent metal oxide is titanium dioxide and the dopants are oxygen vacancies.

4. The nanoscale switching device of claim 1 wherein the source region is present on the side of the non-conducting oxide region opposite to that of the metal oxide layer.

5. The nanoscale switching device of claim 1 wherein the non-conducting portion is thinner than the source portion.

6. A process for making at least one nanoscale switching device of claim 1, comprising:
   providing the first electrode;
   forming on the first electrode the active region disposed over the first electrode; and
   providing the second electrode over the active region,
   wherein either the oxide is formed between the first electrode and the active region or the oxide-is formed between the second electrode and the active region, wherein the electrode with which the oxide layer is associated is metal and wherein the oxide layer is an oxide of the metal.

7. The process of claim 6 wherein the non-conducting portion comprises $TiO_2$ and the dopants comprise oxygen vacancies.

8. The process of claim 6 wherein either the oxide is formed on the first electrode, the non-conducting portion is formed on the oxide, the source portion is formed on the non-conducting portion, and the second electrode is formed on the source portion or the source portion is formed on the first electrode, the non-conducting portion is formed on the source portion, the oxide is formed on the non-conducting portion, and the second electrode is formed on the oxide.

9. A nanoscale crossbar array comprising:
   a first group of conducting nanowires running in a first direction;
   a second group of conducting nanowires-running in a second direction and intersecting the first group of nanowires;
   a plurality of switching devices formed at intersections of the first and second groups of nanowires, each switching device having a first electrode formed by a first nanowire of the first group and a second electrode formed by a second nanowire of the second group, and an active region disposed at the intersection between the first and second nanowires, the active region having a non-conducting portion comprising an electronically semiconducting or nominally insulating and a weak ionic conductor switching material capable of carrying a species of dopants and transporting the dopants under an electric field and a source portion that acts as a source or sink for the dopants; and
   an oxide layer either formed on the first electrode, between the first electrode and the active region or formed on the second electrode, between the second electrode and the active region, wherein the electrode with which the oxide layer is associated is metal and wherein the oxide layer is an oxide of the metal.

10. The nanoscale crossbar array of claim 9 wherein the active region comprises a multi-valent metal oxide.

11. The nanoscale crossbar array of claim 10, wherein the multi-valent metal oxide is titanium dioxide and the dopants are oxygen vacancies.

12. The nanoscale crossbar array of claim 9 wherein the source region is present on the side of the non-conducting oxide region opposite to that of the metal oxide layer.

13. The nanoscale crossbar array of claim 9 wherein the non-conducting portion is thinner than the source portion.

\* \* \* \* \*